United States Patent [19]

Buckler et al.

[11] 4,363,407

[45] Dec. 14, 1982

[54] METHOD AND SYSTEM FOR TESTING AND SORTING BATTERIES

[75] Inventors: Sheldon A. Buckler, Brookline; Jeffrey B. Burns, Natic; Alfredo G. Kniazzeh, West Newton; Paul A. Plasse, Lexington; David J. Sullivan, Bolton, all of Mass.

[73] Assignee: Polaroid Corporation, Cambridge, Mass.

[21] Appl. No.: 227,477

[22] Filed: Jan. 22, 1981

[51] Int. Cl.³ .......................... B07C 5/02; B07C 5/344
[52] U.S. Cl. ...................................... 209/3.3; 209/575; 324/73 AT; 340/636; 429/90
[58] Field of Search ............... 209/3.3, 571, 572, 573, 209/574, 575; 324/73 AT; 340/636, 661; 429/90, 91

[56] References Cited

U.S. PATENT DOCUMENTS

| | | | |
|---|---|---|---|
| 2,540,225 | 2/1951 | Wengel et al. | 209/575 |
| 3,464,549 | 9/1969 | Armbruster | 209/575 |
| 3,761,806 | 9/1973 | Napor | 324/60 C |

Primary Examiner—Allen N. Knowles
Attorney, Agent, or Firm—David R. Thornton

[57] ABSTRACT

A method and system for testing and sorting a production run of sheet-like batteries includes: testing each battery to obtain a first value of electrical energy; placing machine readable indicia on each battery corresponding to the first value; retesting each battery after passage of a period of time to obtain a second value of electrical energy; machine reading the indicia and computing the rate of decay of electrical energy for each battery as a function of the difference between said first and second values per unit time; and sorting the batteries in accordance with the computed rate of decay to separate those batteries having an acceptable rate of decay from those batteries having too great a rate of decay.

16 Claims, 3 Drawing Figures

METHOD AND SYSTEM FOR TESTING AND SORTING BATTERIES

BACKGROUND OF THE INVENTION

This invention relates to battery testing and sorting. More particularly, it concerns a method for testing individual batteries for anticipated shelf-life and culling those individual batteries which are not acceptable.

In the merchandising of most battery powered appliances and the like, it is accepted practice to separately package and retail the batteries required for use of the appliance. Among the reasons for this practice are a different manufacturing origin of the appliance and the batteries, different storing, shipping and handling requirements of the appliance and battery, and possible damage to the appliance by defective batteries. Most germane to these reasons and others for separate merchandising of batteries is that the electric charge stored by substantially all batteries deteriorates in time, without use, so that the batteries exhibit a shelf-life of limited duration whereas the appliance with which they are used will last indefinitely without use if proper storage conditions are met.

An exception to the practice of separately merchandising batteries and related goods is exemplified by the merchandising of photographic film for use in electrically powered cameras. Film packs for use in instant cameras of the type available from Polaroid Corporation, Cambridge, Mass. under the trade designation "POLAROID SX-70 LAND FILM", for example, include a sheet-like battery arranged to be engaged by camera supported contacts upon insertion of the film pack into the camera, thus assuring that the camera powering battery is replaced after exposure and motorized processing of the limited number of film units supplied with each film pack.

The sheet-like batteries used in such film packs employ materials selected to require storage conditions which correspond ideally with those of the photographic film units included in the film pack. Also, the construction of such batteries has been developed to a point where the open circuit voltage decay rate is exceptionally low. In this latter respect, the disclosure of U.S. Pat. No. 4,028,479 is illustrative. In spite of the complementary storage condition requirements and construction of this type of battery, however, the shelf-life characteristics of a given battery are difficult to discern at the time of battery production and often will have a longevity falling below that of the corresponding shelf-life of the film units with which they are packaged.

To minimize film wastage as a result of abnormally short battery shelf-life, current procedures used in the manufacture and testing of such batteries involve a batch or production run sampling technique by which the anticipated shelf-life of each batch or run of batteries is ascertained before any of the individual batteries in such a batch or run are assembled and packaged with film units in a film pack. Specifically, a sampling of batteries manufactured in each production run or batch is tested immediately upon completion for the voltage of the stored electrical charge, and the voltage of the sample is recorded. Samples are then stored for a period of time, retested for voltage charge, the retested voltage compared with the original test voltage and the voltage decay rate computed to provide a measure of shelf-life. If the shelf-life of the sampling of any batch indicates a shelf-life shorter than is acceptable, the entire batch or production run corresponding to the sampling is discarded to insure that only those batches or production runs of batteries exhibiting an acceptable shelf-life will be used.

While the present procedures have demonstrated statistical soundness, it has been found that the shelf-life of individual batteries in a given batch or production run may vary considerably. As a result, many of the batteries discarded as a result of the batch or production run sampling technique are found to exhibit an acceptable shelf-life. Accordingly, current procedures are in need of improvement from the standpoint of reducing battery wastage.

SUMMARY OF THE INVENTION

In accordance with the present invention, a battery sorting method and system is provided by which each individual battery of a production run is first tested after assembly to obtain a first value of electrical energy and forming on each battery so tested, machine readable indicia representative of both that first value of electrical energy and the time at which that value was obtained so that each battery carries such information. This eliminates dependence upon and coordination of remotely stored information which presents a major problem in large scale manufacturing. An initial sorting of the batteries may be effected immediately following this step to cull batteries falling below a specified minimum value of stored electrical energy at the time of manufacture. The batteries remaining after this first sorting procedure, assuming such a first sorting step to be used, or all of the batteries if the first sorting step is not employed, are then stored for a period of time adequate for determining an energy decay rate for each battery. The time of storage may vary with the structural characteristics of the batteries so manufactured, the intended use of the batteries, the accuracy of predicted future decay and also the sensitivity of equipment available to detect the value of electrical energy stored in each battery. After storage, each individual battery of the production run is again tested to obtain a second value of electrical energy. The second test value as well as the time at which it was taken is compared with the first test value and time at which it was taken, all as represented by the indicia previously printed on each battery, to compute an energy decay rate for each battery. The batteries are then sorted to cull those having a decay rate in excess of a predetermined maximum decay rate. The remaining batteries are retained for use on the basis that the shelf-life thereof is acceptable as a projection of the acceptable decay rate computed after the second test.

Among the objects of the present invention are, therefore: the provision of an unique battery sorting method and system by which the shelf-life of each battery in a production run may be projected with a high degree of accuracy; the provision of such a method and system by which defects in manufacture resulting in substandard individual batteries may be detected and substandard individual batteries culled; and the provision of such a battery sorting method and system which is particularly, though not exclusively, adapted for batteries designed to be packaged and merchandised with related goods of predictable shelf-life.

Other objects and further scope of applicability of the present invention will become apparent from the de-

DETAILED DESCRIPTION OF THE PREFERRED EMBODIMENT

Figure 1:
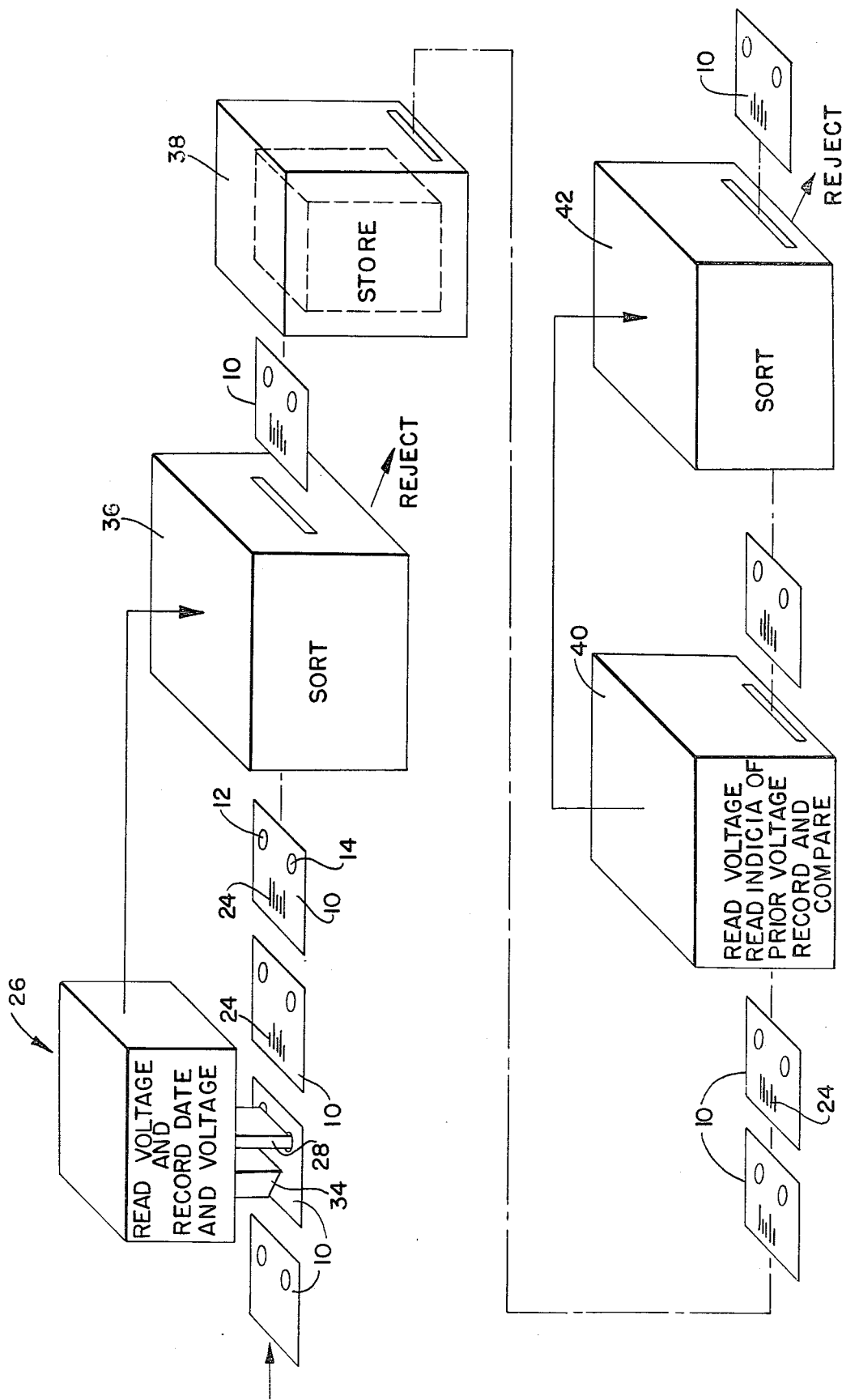
FIG. 1 is a schematic view illustrating the system of the present invention.

Although it will be apparent from the detailed description to follow that the testing system and method of the present invention is applicable broadly to all types of batteries, the embodiment to be described is particularly intended for production run testing and sorting of sheet-like batteries typified by the disclosure of the aforementioned U.S. Pat. No. 4,028,479. An example of such a battery is illustrated most clearly in FIG. 2 and is generally designated in the drawings by the reference numeral 10. A most salient feature of the battery 10 from the standpoint of accommodation to the system and method of the present invention, is that in addition to its flat rectangular sheet-like configuration, the terminals 12 and 14 thereof are presented through openings 16 and 18 in an exterior paper or cardboard layer 20. The outer surface 22 of the layer 20, coupled with the uniformly rectangular peripheral configuration or shape of the battery and of the layer 20, facilitates the reception of printed indicia 24 to be described in more detail below, in a precisely registered position relative to the terminals 12 and 14 and to the peripheral edges of the battery.

Figure 3:
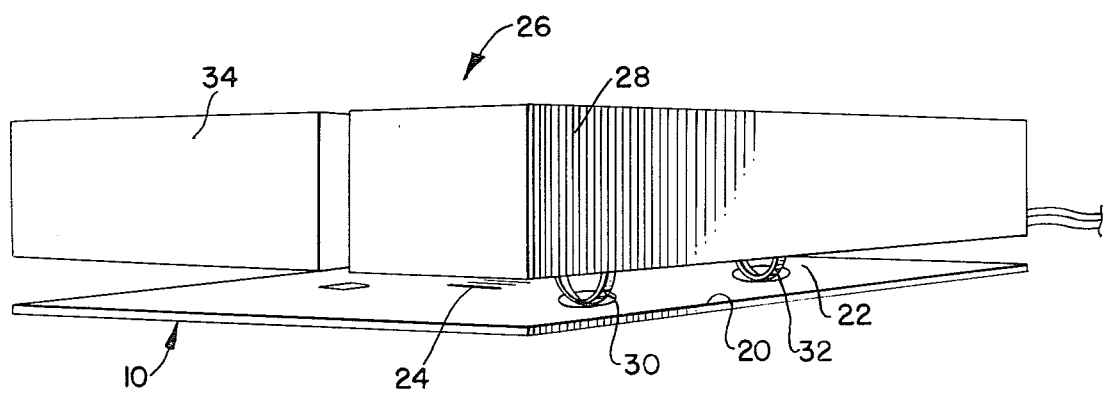
FIG. 3 is a perspective view illustrating in schematic form the organization of a battery testing station incorporated in the system of the present invention.

The batteries 10 are mass produced in batches or runs of several hundred or more individual batteries. The manufacture or assembly of each battery is completed by application of the cardboard layer 20 to the internal cell structure and by a peripheral heat sealing or bonding of the layer 2 to an insulative layer or covering (not shown) on the opposite side of the battery from the layer 20. In accordance with the present invention and as shown in FIG. 1, each battery 10 is passed upon manufacturing completion by an appropriate dispenser or conveyor (not shown) to a first testing station 26. At the station 26, a value of electrical energy stored in each battery 10 is, for example, obtained by, but not limited to, detecting the open circuit voltage of each battery. As shown in FIG. 3, this voltage is detected by a meter 28 having a pair of contact probes or brushes 30 and 32 adapted to engage both terminals 12 and 14 of each battery. The meter 28 may be any of several known types of volt meters capable of generating a signal corresponding to the open circuit voltage across the probes 30 and 32.

Located at the first station with the meter 28 is a recording device or printer 34. The printer 34 is responsive to and controlled by the meter 28 and is operative to form the printed indicia 24 directly on the outer surface 22 of the cardboard battery layer 20. As shown in FIG. 1, the printer 34 is preferably spaced from the battery 10 and is a non-contact printer, for example, an ink jet printer which essentially exerts no force, or quite negligible force, on the battery since only the ink contacts the battery surface. The non-contact printing eliminates the possibility of battery damage due to printing and also may easily accommodate a wide variety of battery configurations such as, for example, cylindrical. While other non-contact printers such as, for example, a laser type will also be applicable, the ink jet printer is relatively maintenance-free and provides excellent indicia.

Figure 2:
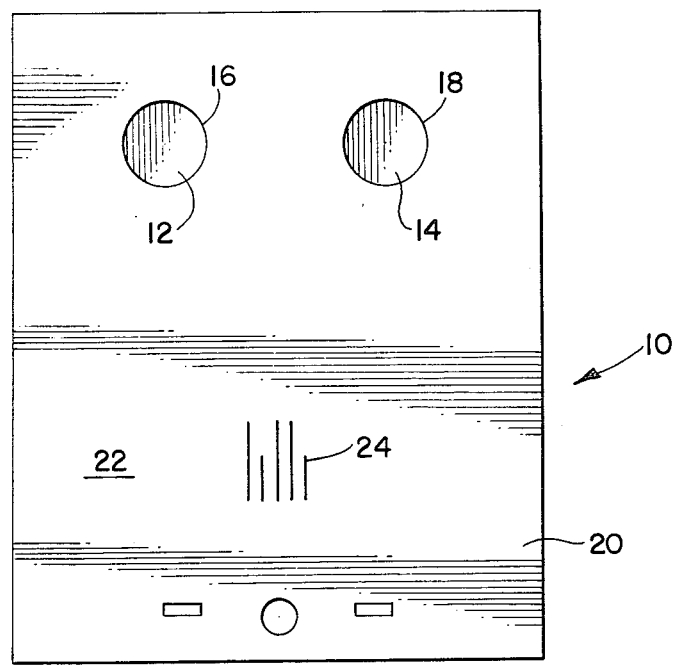
FIG. 2 is a plan view of a battery for which the sorting method and system of the present invention is particularly intended.

As most clearly illustrated in FIG. 2, the indicia is preferably provided as a bar/half bar code in the form of a series of variable height lines representing a binary or other type encoding capable of representing the precise voltage detected by the meter 28 in a form which may be sensed or read by machine. Other forms of indica may also be utilized, and while encoded indicia rather than alphanumerical is preferred for reliability, the latter could also be employed. Hence, the meter 28 and printer 34 provide testing and marking means for providing a first value of battery energy and for placing the measured value on each battery in machine readable form. Further, as noted below, these means also preferably determine and record the time of measurement as well as other manufacturing information. Consequently, the indicia 20 may preferably, but not necessarily, include machine readable information representative of the time at which the voltage for a particular battery 10 was measured by the meter 28. As will be appreciated by those skilled in the art, an encoded indicia of the type illustrated may include information relative to month, day of the month, hour and minute of each day.

After passing the first testing station 26, the batteries 10 may be advanced to a first sorting station 36 operated under the control of the first testing station 26 to cull those batteries for which the initial voltage detected at the station 26 was below a predetermined acceptable limit. Each acceptable battery passing the station 36 is retained and passed to a storage station 38.

In practice, the storage station 38 may take a variety of specific forms such as a plurality of magazine-like receptacles for warehouse storage, or in-line storage bins in which the batteries 10 may be stored for a period of time, or delay period, determined in accordance with such factors as the anticipated voltage decay rate of the batteries as well as the sensitivity of the metering equipment used in the system for detecting the open circuit voltage for each battery. In other words, it is necessary only that the batteries remain at the storage station 38 for a period of time adequate to undergo a discernible voltage decay from the voltage detected at the first testing station 26. However, since the purpose is to extrapolate or predict from a measured decay the subsequent time, many months or years later, at which the battery energy will fall below a given value, a reasonable decay period of several weeks is preferred.

After storage, the batteries are again tested by passing them to a second testing station 40. As suggested by the legend in FIG. 1 of the drawings, at the station 40 the open circuit voltage of each battery 10 is again detected, the voltage recorded at the first testing station and represented by the indicia 24 on each battery 10 is read, the two voltage readings are compared and the voltage decay rate for each battery computed. Hence the station 40 provides testing and reading means for providing or obtaining a second value for each battery after the time interval, for reading the original value (and original test time if provided) and for comparing the first and second values and computing the rate of decay of the battery under test.

As above-indicated, the indicia 24 preferably carries information as to the time at which the first voltage reading was taken at the station 24. The availability of this information on each battery 10 at the second testing station 40 provides data by which the voltage decay rate for each battery may be directly computed. In the latter case, station 40 compares the two voltage values and also the first and second test time to determine the specific length of time the batteries 10 were retained between tests.

Alternatively, storage for a fixed period of time might be used in lieu of recording the time of the first test voltage. In other words, if the time interval between each battery 10 passing the first test station 26 and passing the second test station 40 was constant, the voltage decay rate could be computed without a need for recording the time of the test at the first station 26.

After passing the second station 40, the batteries are passed through a second storing station 42, which is responsive to and controlled by the test station 40 and operative to reject those individual batteries 10 for which the computed decay rate is in excess of a pre-established or acceptable decay rate. Thus, only those batteries which pass from the sorting station 42 to a packaging station (not shown) will have a tested decay rate corresponding to an acceptable battery shelf-life.

It will be appreciated therefore, that as a result of the present invention, a highly effective battery sorting method and system is provided by which the aforementioned objectives are completely fulfilled. It is contemplated that changes and/or modifications may be made to the embodiment disclosed herein without departure from the invention. Accordingly, it is expressly intended that the foregoing description is illustrative of a preferred embodiment, not limiting and that the true spirit and scope of the invention be determined by reference to the appended claims.

What is claimed is:

1. The method of testing and sorting a production run of electric batteries prior to assembly and packaging thereof with related goods to be merchandised with individual batteries of such a production run, said method comprising the steps of:
    (a) testing each individual battery of the production run to obtain a first value of electrical energy for each such battery;
    (b) forming machine readable indicia on each such battery corresponding to said first value;
    (c) storing the batteries after completion of steps (a) and (b);
    (d) retesting each of the individual batteries after passage of an elapsed period of time following step (a) to obtain a second value of electrical energy for each battery;
    (e) machine reading said indicia and computing, in accordance with said elapsed period of time of each battery, the rate of decay of electrical energy for each individual battery as a function of the difference between said first and second values per unit time; and
    (f) sorting said batteries in accordance with said computed rate of decay to separate those individual batteries of the production run having a rate of stored energy decay extending an acceptable value from those batteries of the same production run having a rate of stored energy decay equal to or lower than said acceptable value.

2. The method of claim 1 including forming, prior to step (c) on each battery, machine readable indicia representative of the time of testing in step (a), and computing in step (c) the elapsed period of time between step (a) and step (d).

3. The method of claim 2, wherein said step of storing the batteries comprises storing the batteries for variable periods of time.

4. The method of claim 1, further comprising the step of sorting the batteries after completion of steps (a) and (b) in accordance with the first value of electrical energy to separate those individual batteries having a first value of electrical energy above or below an acceptable range of first values from those batteries having a first value of electrical energy within said acceptable range.

5. The method of claim 1, wherein said step of storing the batteries comprises storing the batteries for a fixed period of time so that said computing of the rate of decay is a function solely of the difference between said first and second values.

6. The method of claim 1, wherein said step of forming machine readable indicia includes forming said indicia by a non-contact printer.

7. The method of claim 1, wherein said step of forming machine readable indicia includes forming said indicia with only negligible force applied to said battery.

8. The method of claim 7, wherein said step of forming said machine readable indicia is provided by directing ink to said battery to form said indicia by means of an ink jet printer.

9. The method of testing and sorting a production run of sheet-like, rectangular electric batteries of the type having terminals presented through an exterior layer receptive to placement of indicia by printing, said method comprising the steps of:
    (a) testing each individual battery of the production run to obtain a first value of electrical energy for each such battery;
    (b) placing machine readable indicia on said exterior layer of each such battery corresponding to said first value;
    (c) storing the batteries after completion of steps (a) and (b);
    (d) retesting each of the individual batteries after passage of an elapsed period of time to obtain a second value of electrical energy for each battery;
    (e) machine reading said indicia and computing, in accordance with said elapsed period of time of each battery, the rate of decay of electrical energy for each individual battery as a function of the difference between said first and second values per unit time; and
    (f) sorting said batteries in accordance with said computed rate of decay to separate those individual batteries of the production run having a rate of stored energy decay exceeding an acceptable value from those batteries of the same production run having a rate of stored energy decay equal to or lower than said acceptable value.

10. The method of claim 9 including forming, prior to step (c) on each battery, machine readable indicia representative of the time of testing in step (a), and computing in step (d) the elapsed period of time between step (a) and step (d).

11. A system for testing and sorting a production run of electric batteries prior to assembly and packaging thereof with related goods to be merchandised with individual batteries of such a production run, said system comprising:

testing and marking means for obtaining a first value of electrical energy for each individual battery of the production run and for placing machine readable indicia on each such battery corresponding to said first value;

testing and reading means for obtaining a second value of electrical energy for each battery after an elapsed period of time, for machine reading said indicia and for computing, in accordance with the elapsed period of time of each battery, the rate of decay of electrical energy for each individual battery as a function of the difference between said first and second values per unit time; and means for sorting said batteries in accordance with said computed rate of decay to separate those individual batteries of the production run having a rate of stored energy decay exceeding an acceptable value from those batteries of the same production run having a rate of stored energy decay equal to or lower than said acceptable value.

12. The system of claim 11 wherein said testing and marking means includes means for also placing machine readable indicia on each battery representative of the time of obtaining said first value and said testing and reading means includes means for reading the time of obtaining said first value and computing the elapsed period of time for each battery.

13. The system of claim 11, wherein said marking means is a non-contact printer spaced from said batteries.

14. The system of claim 11, further including preliminary means, responsive to said means for obtaining a first value, for sorting said batteries in accordance with said obtained first value of electrical energy.

15. The system of claim 11, wherein the testing and marking means are juxtaposed at a single station.

16. The system of claim 11, wherein the testing and reading means are juxtaposed at a single station.

* * * * *